United States Patent [19]

Fettweis

[11] Patent Number: 4,866,649

[45] Date of Patent: Sep. 12, 1989

[54] MULTI-DIMENSIONAL DIGITAL FILTER HAVING ADDERS, MULTIPLIERS AND SHIFT ELEMENTS

[75] Inventor: Alfred Fettweis, Bochum, Fed. Rep. of Germany

[73] Assignee: Siemens Aktiengesellschaft, Berlin and Munich, Fed. Rep. of Germany

[21] Appl. No.: 116,204

[22] Filed: Nov. 3, 1987

[30] Foreign Application Priority Data

Nov. 12, 1986 [DE] Fed. Rep. of Germany ....... 3638570

[51] Int. Cl.$^4$ ................................................. G06F 7/38
[52] U.S. Cl. ........................... 364/724.14; 364/724.05; 333/167
[58] Field of Search ........... 364/724, 723, 724, 724.14, 364/724.05; 333/166, 173, 167; 370/70

[56] References Cited

U.S. PATENT DOCUMENTS

| | | | |
|---|---|---|---|
| 3,919,671 | 11/1975 | Fettweis et al. | ...................... 333/167 |
| 3,967,099 | 6/1976 | Fettweis | .......................... 364/724.14 |
| 3,980,872 | 9/1976 | Fettweis et al. | ................ 364/724.14 |
| 4,020,333 | 4/1977 | Nussbaumer | ......................... 364/724 |
| 4,061,905 | 12/1977 | Fettweis | .......................... 364/724.14 |
| 4,236,224 | 11/1980 | Chang | .................... 364/724 |
| 4,326,288 | 4/1982 | Fettweis | .................... 370/70 |
| 4,356,464 | 10/1982 | Fettweiss | ............................ 333/173 |
| 4,736,392 | 4/1988 | Kammeyer et al. | ............ 364/724 X |
| 4,760,542 | 7/1988 | Mehrgardt et al. | .................. 364/724 |

FOREIGN PATENT DOCUMENTS

0240820 10/1987 European Pat. Off. ............ 364/724

Primary Examiner—Eugene R. LaRoche
Assistant Examiner—Seung Ham
Attorney, Agent, or Firm—Hill, Van Santen, Steadman & Simpson

[57] ABSTRACT

Multi-dimensional digital filters have such a circuit structure that their transfer function corresponds to that of an antimetrical filter, and have a characteristic function that is a rational function of the squares of the equivalent complex frequencies. Multi-dimensional filters, wave digital filters as well, can thereby be realized having a closed attenuation behavior.

2 Claims, 1 Drawing Sheet

MULTI-DIMENSIONAL DIGITAL FILTER HAVING ADDERS, MULTIPLIERS AND SHIFT ELEMENTS

BACKGROUND OF THE INVENTION

The invention is directed to a multi-dimensional (k-dimensional) digital filter and more particularly to such a filter which is made up of adders, multipliers and shift elements.

Filters of this species are known, for example, from the periodical IEEE Transactions on Circuits and Systems, Vol. Cas-31, No. 1, January 1984, pages 31 through 48. Digital circuits and systems are described, including multi-dimensional digital filters. Wave digital filters have been described as specific digital filters in, for example, the periodical AEU, Vol. 25, 1971, pages 79 through 89 and also in German Pat. No. 20 27 303, these representing a specific species of digital filters. Classes of filters can be directly simulated in these wave digital filters. Finally, German Pat. No. 26 39 568 discloses multi-dimensional wave digital filters. A specific species of such wave digital filters has been described in K. Meerkotter, "Antimetric wave digital filters derived from complex reference circuits", Proc. Eur. Conf. Circuit Theory and Design, Stuttgart, W. Germany, September 1983, pages 217 through 220. Antimetrical wave digital filters that are derived from complex reference circuits are discussed therein (author: Klaus Meerkotter).

The use of such filters depends substantially on the respectively available technology. However, advances that have been achieved in VLSI technology bring real-time multi-dimensional filters into the realm of practical realization in comparison to earlier, complicated and comparatively slow computers. A bibliography of publications is attached hereto as an Appendix.

SUMMARY OF THE INVENTION

The object of the invention is to specify multi-dimensional digital filters wherein the number of switch elements required remains as small as possible and undesirable disturbances that are caused by the digital filter technology remain as low as possible. Digital filters having closed attenuation behavior that are derived by methods of complex network theory are also achieved by the presention invention.

This object is achieved by the invention by using structure for the filter which has a transfer function corresponding to an antimetrical filter with a characteristic function which is a rational function of the squares of the equivalent complex frequencies. A variety of different filter types can be realized in this way.

SUMMARY OF THE DRAWINGS

The invention shall be set forth in yet greater detail below with reference to exemplary embodiments. Shown in the drawing are.

DESCRIPTION OF THE PREFERRED EMBODIMENT

Multi-dimensional digital filters that have closed attenuation behavior and that are designed with methods of complex network theory shall be described. A very advantageous approximation to the design of compact, multi-dimensional filters with closed attentuation behavior (for example, an attenuation behavior that proceeds approximately circularly, spherically or symmetrically in a related way) is described. The design is aimed at the use of results from the theory of classic complex circuits. The transfer functions that derive can be implemented with the assistance of suitable, multi-dimensional digital filter structures, particularly in the form of multi-dimensional wave digital filters. Very effective design possibilities derive therefrom, offering all the advantages that can also be achieved by employing wave digital filters.

Figure 1:
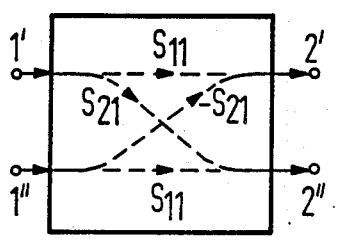
FIG. 1 is a diagram showing the realization of real transfer functions $S_{11}$ and $S_{21}$ with one-port having the transfer function $S_a = S_{11} + jS_{21}$.

FIG. 1 shows a circuit in general that represents a complex one-port, meaning that the signal is composed of a real part and an imaginary part. The input is therefore referenced 1' and 1". The directional arrows indicate that real part and imaginary part of the signal flow into the one-port. In a corresponding way, the output signal is also composed of a real part and an imaginary part, for which reason the outputs are referenced with reference numerals 2' and 2". The broken lines within the complex one-port show how the real transfer functions $S_{11}$ through $S_{21}$ are realized with a complex transfer function $S_a = S_{11} + jS_{21}$. The broken line referenced $S_{11}$ thus proceeds from 1' to 2' or, respectively, from 1" to 2"; the broken line $S_{21}$ proceeds from 1' to 2"; and a broken line $-S_{21}$ proceeds in corresponding fashion from 1" to 2'. The directional arrows are also illustrated for the transfer functions.

Figure 2:
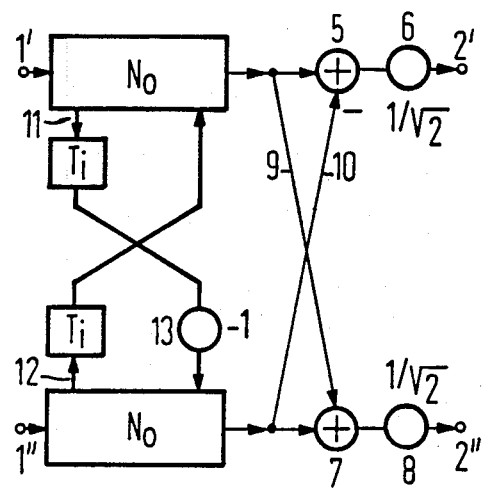
FIG. 2 is a block diagram showing the realization of a complex all-pass function $S_i$ with an antimetric transfer function with the networkds $N_0$ performing only real arithmetic operations and with the thicker lines denoting connections of required multiplicity.

Circuit structures having the equivalent effect in FIG. 2 are provided with the same reference numerals as in FIG. 1. The input 1' is followed by a network $N_0$ that executes all real arithmetic operations. The point 2' is reached via an adder 5 and via a circuit 6 that performs the operation $1/\sqrt{2}$. Correspondingly, the input 1" also leads to a network $N_0$ that also executes only real arithmetic operations. The output 2" is reached via an adder 7 and via a circuit 8 that again forms the operation $1/\sqrt{2}$. A line 9 leads from the output of the upper network $N_0$ to the adder 7 which lies in the lower branch, and a line 10 correspondingly leads from the output of the lower network $N_0$ to the adder 5 which lies in the upper branch. A minus sign at the line 10 indicates a phase reversal. A front output line 11 of the upper network $N_0$ leads to a back input of the lower network $N_0$ via a circuit $T_i$ and a circuit 13 in which a phase reversal is effected $(-1)$. Correspondingly, a line 12 leads from the front output of the lower network $N_0$ to the back input of the upper network $N_0$ via a circuit $T_i$. For one-dimensional filters, this circuit is known per se from reference [15] in the Appendix hereto. All solid lines drawn thicker in FIG. 2 identify multiple connections whose multiplicity respectively corresponds to the degree of the all-pass function $S_i$ that is allocated to the $i^{th}$ dimension. By cascading K circuits of the type shown in FIG. 2, a complex all-pass function $S_1, S_2 \ldots S_k$ is realized wherein the circuit structure is fashioned such that its transfer function corresponds to that of an arithmetic filter and thereby has a characteristic funtion that is a rational function of the squares of the equivalent complex frequencies ($\psi_i$ wherein $i=1$ through k).

Figure 3:
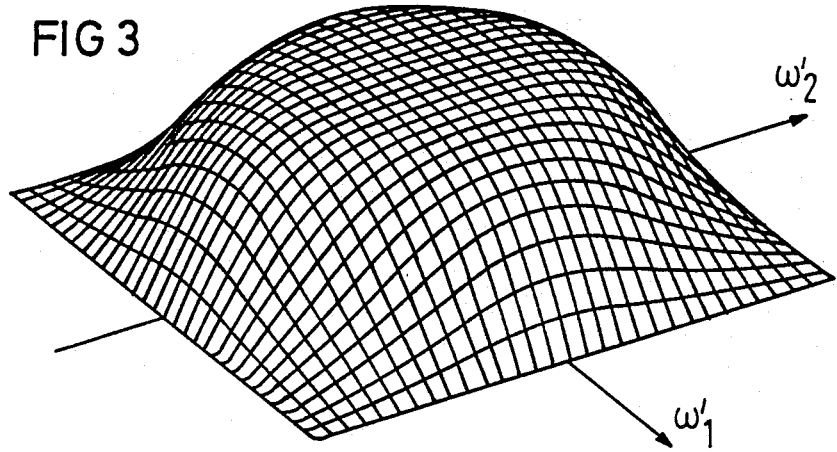
FIG. 3 illustrates the size relationships for the simplest possible example at the two axes $\omega_1'$, and $\omega_2'$.

FIG. 3 shows the size relationships for the simplest possible example along two axes $\omega'_1$ and $\omega'_2$, that reside perpendicular to one another.

In the following, references to the Appendix are indicated in square brackets.

Corresponding to the respective attenuation behavior, there are two large groups of multi-dimensional (MD) filters, namely those for which it can be said that their behavior is open and those for which it is said in general that their behavior is closed. What are referred to as fan filters are included in the filters having open attenuation behavior; for these, the boundary between pass band and stop band extends up to the corresponding Nyquist limit or—when a suitably transformed frequency variable is used—up to inifinity. On the other hand, filters having closed attenuation behavior are essentially characterized by the fact that lines (surfaces, hyper-surfaces) that separate the pass band, the transition region and the stop band are closed; particularly included in these are filters whose attenuation behavior has nearly circular (spherical, hyperspherical) symmetry, though it should be noted that this kind of extreme symmetry is not necessary for the practical realization. Some general references on multi-dimensional digital filters (MD) are, for example, references [1] through [4].

From an entirely different point of view, a distinction is made in classic, loss-free circuits between two (mainly two-port) filter types, namely those that are asymmetrical and those that are antimetrical, these latter also being referred to as anti-symmetrical. These filters also represent the majority of circuits that are used as reference filters for wave digital filters (WDF) [5], and these considerations apply not only to one-dimensional (1D) wave digital filters (WDF) but also to multi-dimensional wave digital filters (MD WDF) according to references [5] through [7]. An interesting observation is that symmetrical two-ports seem especially suited for the design of fan filters, as likewise proceeds from the corresponding solutions that were already described earlier in references [5], [8] through [10]; whereas antimetrical two-ports, as shall be shown below, are suitable for the design of MD-filters (multi-dimensional) having a closed attenuation behavior. The required transfer function can be realized as a wave digital filter since all the advantages thereof can thus also be grasped (See [5] through [7], [11] for a description of these advantages). In the meantime, a realization with the assistance of some standard, multi-dimensional digital filter approximation is equally possible when desired, but the resulting realization is generally significantly less attractive in the light of the required coefficient precision, the dynamic range, the stability, and the finite arithmetic conditions, and the number of multipliers and adders which are needed.

The general interest for the pending problem is in real filters, but this development makes rather great use of the theory of complex classic circuits [12], [13] and of that of complex wave digital filters [13] through [15]. The reason is as follows. It is known that a canonical realization for classic, symmetrical two-ports is possible with the assistance of what are referred to as lattice section structure that contain two canonical reactances; these reactances are real. There are no similar canonical structures comprising real reactances for anti-metric filters; however, such structures are possible, with the assistance of structures that are similar to those for real two-ports when the canonical reactances are complex ([13] through [16]). The solution achieved by the present invention is significantly more effective than all earlier ones for the design of wave digital filters having closed attenuation behavior according to the references [5] through [7], [17], [18], including those described in reference [7].

Whereas the solution that is obtained for fan filters, [5], [8] through [10], is based on cross-antimetrical reference filters and is limited to two-dimensional (2D) filters, the solution of this invention is applicable to any arbitrary plurality, k, even to dimensions such as, for example, $k=2$ (this likewise being the case for the design method that is based on rotations, [5] through [7], [17] through [20]). Even when it is only very approximate estimates that are applied for the selection of suitable numerical values, noticeably good attenuation dependencies are obtained and this can be further improved by applying numerical optimization methods.

The solution is based on the observation that the so-called characteristic function of a filter having closed attenuation behavior must preferably be a rational function of the squares of the equivalent frequency parameters, as described later. After the general principles have been set forth below, it shall be shown that the solution that is obtained covers the totality of all possible multi-dimensional (MD) classic filter structures and, thus, also covers the totality of all multi-dimensional wave digital filters (MD WDF) for which the characteristic function has the property just recited. Loss-free, antimetrical two-ports are also discussed below.

We proceed on the basis of k dimensions and, correspondingly therewith, k complex frequencies $\rho_i = \sigma_i + j\omega_i$, where $i-1$ to k, which are combined to form a k-tuplet $$\rho = (\rho_1, \ldots, \rho_k). \tag{1}$$

Let $t_i$ be the fundametal shift in the dimension i. It is well-known that it is definitely permissible to consider the variables $$z_i = e^{-\rho_i T_i} \tag{2}$$

instead of the $\rho_i$ or, equivalent thereto, the variables $\psi_i$ that are defined as follows:

$$\psi_i = (1-z_i)/(1+z_i) = \tan h(\rho_i T_i/2). \tag{3}$$

The corresponding k-tuplet is thus $$\psi = (\psi_1, \ldots, \psi_k). \tag{4}$$

The variables $\psi_i$ play the part of (equivalent) complex frequencies. For real frequencies, i.e. for $\rho_i = j\omega_i$, we have $$\psi_i = j\phi_i, \phi_i = \tan(\omega_i T_i/2). \tag{5}$$

The letters $\omega_i$ and $\phi_i$ are always assumed such that they represent real numbers, and the corresponding k-tuplets are $$\omega = (\omega_1, \ldots, \omega_k), \phi = (\phi_1, \ldots, \phi_k). \tag{6}$$

It is expedient to represent a loss-free two-port that shall be referenced N with its scattering matrix $$S = \begin{bmatrix} S_{11} & S_{12} \\ S_{21} & S_{22} \end{bmatrix} \quad (7)$$

where $S_{21}$ and $S_{11}$ are the two transmittances and $S_{11}$ and $S_{22}$ are the two reflectances [12]. As known [21,22], the scattering matrices can be brought into the canonical form that represents a generalization of that for the one-dimensional case [12], i.e.

$$S = \frac{1}{g}\begin{bmatrix} h & \gamma f_* \\ f & -\gamma h_* \end{bmatrix} \quad (8)$$

whereby the following are valid:

1. f, g and h are polynomials that have the following relationship to one another $$gg_* = hh_* + ff_*; \quad (9)$$

one of the coefficients in one of these polynomials can be arbitrarily selected.

2. g is a scattering Hurwitz polynomial, i.e. is such that
   (a) $g(\psi) \neq 0$ for Re $\psi > 0$
   (b) g and $g_*$
are relatively prime.

3. $\gamma$ is a unimodular constant ($|\gamma| = 1$).

4. The lower (or subscript) asterisk denotes the paraconjugate, i.e.

$$F_*(\psi) = F^*(-\psi^*), \text{ etc.,} \quad (10)$$

for scalar functions (which are being considered here).

The superscript asterisk denotes a complex conjugation and $\psi^*$ is the corresponding k-tuplet $$\psi^* = (\psi^*_1, \ldots, \psi^*_k).$$

These results are valid regardless of whether N is real or complex.

5. When the two-port is real, all coefficients in S can be selected to be real, i.e. f, g and h are then real polynomials and $\gamma = \pm 1$, whereas we also have $F_* = F(-\psi)$, etc.

For $\psi = j\theta$, the attenuation is $\alpha$, established by $$\alpha = -\ln|S_{21}| = \tfrac{1}{2}\ln(1 + |\Psi|^2) \quad (11)$$

where $$\Psi = S_{11}/S_{21} = h/f \quad (12)$$

is the so-called characteristic function of N. When N is antimetrical, then, as per definition, we have $$S_{21} = S_{12}, \quad S_{11} = -S_{22} \quad (13a,b)$$

and, thus, $$h = \gamma h_*, \quad f = \gamma f_*, \quad \Psi_* = \Psi \quad (14,a,b,c)$$

Inversely, when the equations (13a) and (14c) are valid, then this is also true for equation (13b), i.e. N is then antimetrical.

It shall be assumed below that N is in fact antimetrical. New functions $$S_a = S_{11} + jS_{21}, \quad S_b = S_{11} - jS_{21} \quad (15)$$

are introduced which are thus generally not real but complex rational functions in $\psi$. It follows from equation (8) that $$S_a = (h + jf)/g, \quad S_b = (h - jf)/g \quad (16a,b)$$

and, thus, from equations (9) and (14b) that $$S_a S_{a*} = S_b S_{b*} = 1. \quad (17)$$

Let $g_a$ and $g_b$ be denominators having the lowest degree of $S_a$ and $S_b$. It then follows from equation (16) that $g_a$ and $g_b$ divide the value g and are thus scattering Hurwitz polynomials [22] themselves. Consequently (as can be demonstrated in that, for example, $S_a f_a / g_a$ id entered and equation (17) is used), $S_a$ and $S_b$ can be written in the following form $$S_a = \gamma_a g_{a*}/g_a, \quad S_b = \gamma_b g_{b*}/g_b \quad (18a,b)$$

whereby $\gamma_a$ and $\gamma_b$ are unimodular constants ($|\gamma_a| = |\gamma_b| = 1$). Inversely, when one proceeds on the basis of equation (18) and calculates S in that equations (13) and (15) are used, an expression in the form of equation (8) according to equation (19) is obtained, whereby equation (9) is also satisfied $$g = g_a g_b, \quad h = (\gamma_a g_{a*} g_b + \gamma_b g_a g_{b*})/2 \quad (19)$$
$$\gamma = \gamma_a \gamma_b, \quad f = (\gamma_a g_{a*} g_b - \gamma_b g_a g_{b*})/2j$$

We shall now specifically assume that N is a real, antimetrical two-port. Even then, $S_a$ and $S_b$ are complex functions (in the light of equation (15)) and the same is also valid for the values $g_a$ and $g_b$, whereas $\gamma_a$ and $\gamma_b$ can likewise be complex. Over and above this, $S_a$ and $S_b$ are now linked by equation (20), $$\overline{S_b} = S_a, \quad \overline{S_a} = S_b, \quad (20)$$

wherein it should be noted that a notation like $\overline{S_a}$ is defined by $\overline{S_a}(\psi) = S^*_a(\psi^*)$ and thus represents the biconjugate of $S_a$ [15]. It can be concluded from equations (18) and (20) that (possibly after attaching a suitable, real factor to, for example, the value $g_b$) the validity of equation (21) can be assumed.

$$\overline{g_b} = g_a, \quad \gamma_b = \gamma_a^*. \quad (21)$$

Over and above this, it follows from equation (15) that $$S_{11} = Ra S_a = (S_a + \overline{S_a})/2,$$
$$S_{21} = Ia S_a = (S_a - \overline{S_a})/2j \quad (22a,b)$$

whereby Ra denotes the real-analytical (or the realytical) part, whereas Ia denotes the imaginary-analytical (or the imalytical) part of the function under consideration. It should be noted that Ra F and Ia F are likewise anaytical functions in $\psi$ for an analytical function, for instant $F = F(\psi)$, by contrast to the case for Re F and Im F; and that we have $\overline{F} = F$ for a real function.

It can be concluded from equations (12), (18) and (22) that $$\psi = j(1+\rho)/(1-\rho) = -d'/d'' \qquad (23)$$

whereby $$\rho = \bar{S}_a/S_a = \bar{d}/d \qquad (24)$$

and d, d' and d'' are the polynomials that are defined by equation (25), $$d = \gamma^o{}_a g_a g_a{}^*, \quad d' = \mathcal{R}ad, \quad d'' = \mathcal{I}ad. \qquad (25)$$

Obviously, $\bar{g}_{a*}(\psi) = g_a(-\psi)$, so that d is an even polynomial in $\psi$. Over and above this, we have $\rho = 1/\bar{\rho}$ and, thus $\Psi = \bar{\Psi}$, this confirming that $\Psi$ is a real, even function in $\psi$.

When, conversely, one proceeds from a give (complex) Hurwitz polynomial $g_a$ and some unimodular constant $\gamma_a$ or other, $S_a$ and $S_b$ can be derived with the assistance of equations (18) and (21) and, thus S can be derived with the assistance of equations (13) and (22). The properties for d and $\Psi$ that were just described are then met. However, the synthesis of N does not require consideration of equation (19) but can ensue on the basis of general design methods as described, for example, in reference [14] or can ensue directly upon employment of equation (15) and, thus, equation (22) [13]. In fact, when the real (1') and imaginary (1'') inputs quantities as well as the real and imaginary output quantities (2', 2'') are established by H, the real transfer functions from 1' to 2' and from 1''to 22'' are given by $\mathcal{R}a$ H whereas that from 1' to 2'' is established by $\mathcal{I}a$ H and that from 1'' to 2' is established by $-\mathcal{I}a$ H. It thus follows from equation (22) that the real transfer functions $S_{11}$ and $S_{21}$ for a complex one-port having the transfer function $S_a$ are obtained as shown in FIG. 1. In this way, the problem of synthesizing a real loss-free antimetrical two-port is reduced to the synthesis of a loss-free, but complex one-port.

Let two-ports having closed attenuation behavior also be discussed below, whereby the derivation of a suitable characteristic function shall be shown first.

When one wishes to have closed attenuation behavior, the actual demands generally have some form of symmetry that can be mathematically expressed in the form $$a(j\epsilon_1\phi_1, \ldots, j\epsilon_k\phi_k) = a(j\phi_1, \ldots, j\phi_k)$$

where either $\epsilon_i = 1$ or $\epsilon_i = -1$ for any $i \in \{1, \ldots, k\}$. For $k = 2$, such a demand corresponds to the quadrantal symmetry [23,24]. It would be best if the modulus of the transmittance $S_{21}$ had this symmetry, or, this amounting to the same, the real rational function $\Psi$ had a corresponding symmetry (cf. equation (11)). This demand is obviously met when $\Psi$ is rational in the $\phi_i^2$ for $\psi = j\phi$, i.e. when $\Psi$ is rational in $\psi_i^2$, $i = 1$ through k. In this case, equation (14c) is clearly satisfied. Consequently, an attempt can be made to find a solution with the assistance of a real antimetrical two-port, vix, with the assistance of a complex one-port having an all-pass transfer function $S_a$. This essentially requires finding a complex Hurwitz polynomial $g_a$, whereas the existence of the constant $\gamma_a$ produces an additional, further freedom.

In order to find such a suitable polynomial $g_a$, let it be assumed that $g_a$ can be written in factor form $$g_a = g_1 g_2 \cdots g_k \qquad (26)$$

whereby $g_i = g_i(\psi_i)$ is dependent only on $\psi_i$ for all $i = 1$ through k. In this case, the polynomial d as defined by equation (25) can be written in the following form:

$$d = \gamma^*_a \prod_{i=1}^{k} d_i, \qquad (27)$$

whereby since $\bar{g}_{i*}(\psi_i) = g_i(-\psi_i)$, it follows that $$d_i = g_i(\psi_i) g_i(-\psi_i), \qquad (28)$$

i.e. $d_i = d_i(\psi_i^2)$ is in fact a polynomial in $\psi_i^2$ and this is also valid for $\bar{d}_i$. It therefore allows from equations (23) and (24) that the real function $\psi$ is not only rational and even in $\psi$ but is in fact a real rational function in the individual $\psi_i^2$ and, thus, in $(\psi_1^2, \ldots, \psi_k^2)$.

Some specific design principles will now be specified.

In general, the demandss to be made of a filter are such that one cannot expect to be in the position of finding a direct analytical procedure with which an optimum characteristic function based on the previous results could be determined. For this reasons, numerical optimizations are generally necessary. Nonetheless, it is of interest to examine that case in somewhat greater detail wherein the desired result is symmetrical in all variables. In this case, we need only a single, different polynomial, namely $g_0$, and it can then be written $$g_i = g_o(\psi_i), \, i = 1 \text{ to } k. \qquad (29)$$

When, in particular, the behavior is considered along a main axis, for example along the axis $\psi_2 = \ldots \psi_k = 0$, then $S_a$, $\rho$ and $\Psi$ are reduced to expressions that are combined with one another in the following way.

$$S_o = S_o(\psi_1), \, \rho_o = \rho_o(\psi_1), \text{ and } \Psi_o = \Psi_o(\psi_1^2)$$

$$S_o = \gamma_o g_o*(\psi_1)/g_o(\psi_1), \qquad (30)$$

$$\Psi_o = j(1+\rho_o)/1-\rho_o), \, \rho_o = (\Psi_o+1)/(j\Psi_o-1). \qquad (31a,b)$$

The unimodular constant $\sqrt{\gamma_o}$ is thereby given with $$\gamma_o = \gamma_a[|g_o(0)|/g_o(0)]^{2k-2} \qquad (32)$$

For $\rho_o$, $$\rho_o = \bar{S}_o/S_o = \bar{d}_o/d_o \qquad (33)$$

is obtained, where the polynomial $d_o = d_o(\psi_1^2)$ is defined by $$d_o(\psi_1^2) = \gamma^*_o g_o(\psi_1) g_o(-\psi_1). \qquad (34)$$

The design can now proceed in that a suitable, one-dimensional, real rational function $\Psi_o(\psi_1^2)$ is selected. Because $\Psi_o = \bar{\Psi}_o$, the conclusion is drawn from equation (31) that the resulting $\rho_o$ meets the following condition:

$$\rho_o = 1/\bar{\rho}_o. \qquad (35)$$

A polynomidal $d_o$ for which condition $\rho_o = \bar{d}_o/\bar{d}_o$ is valid (cf. equation (33)) can be consequently be found. When $\rho_o = a/b$ is in fact written, whereby a and b are relatively prime polynomials, then, taking equation (35) into consideration, one finds that these satisfy the condition $a\bar{a} = b\bar{b}$. They are thus not only of the same degree but also such that $$a = bq, \quad b = aq$$

are valid, whereby q is a constant for which $|q| = 1$ is found. Consequently, $d_o \pm a(g^*)^{\frac{1}{2}}$ can be selected. It follows therefrom that the resulting $d_o$ is relatively prime with $\bar{d}_o$.

A (complex) Hurwitz polynomial $g_o(\psi_1)$ and a unimodular constant $\gamma_o$ can now be determined such that equation (34) is satisfied. This is always possible since $d_o$ that is even with $\psi_1$ and relatively prime with $\bar{d}_o$ can have no zero places in common with $\bar{g}_o$; it thereby becomes clear that the resulting $g_o$ is relatively prime with $\bar{g}_o$. $\gamma_a$ is then determined with the assistance of equation (32) and $g_a$ is determined with the assistance of equations (26) and (29).

The method just set forth can be easily generalized for that case wherein a different behavior along one of the major axes is selected. When a somewhat more generalized behavior is wanted, one begins in that $g_i(\psi_i)$ is written in a suitable parametrical form, for example in the form $$g_i(\psi_i) = \pi_\nu (\psi_i + a_{i\nu} + jb_{i\nu})$$

whereby the $a_{i\nu}$ and $b_{i\nu}$ are constants with $a_{i\nu} > 0$ Subsequently, an aritrary, unimodulator constant $\gamma_a$ is selected and $g_a$ is obtained with the assistance of equation (26). The $a_{i\nu}$ and $b_{i\nu}$ as well as the $\gamma_a$ are then determined with a suitable optimization method.

Regardless of the method that is used, the synthesis is finally completed by finding a suitable structure for the realization of $S_a$. One possibility therefor is comprised of the following. When equations (18a) and (26) are used, $S_a$ can be written in the following form.

$$S_a = 6 S'_a S_1 S_2 \ldots S_k \quad (36)$$

Thereby valid is $$S_i = \gamma_i g_{i*}/g_i, \quad \gamma'_a = \gamma_a \gamma^*_1 \gamma^*_2 \ldots \gamma^*_k \quad (37)$$

where $\gamma$ for $i = 1$ to k are arbitrary unimodular constants.

With the exception of the constant $\gamma'_a$ which would be trivial to take into consideration the synthesis is thus reduced to the realization of the individual k one-dimensional all-pass functions $S_i$. As shown in the reference [13] through [15], this is always possible, especially with the assistance of wave digital filter structures (WDF).

Some interesting, special instances can be considered. A first occurs when, given the assumption that equations (29) and, thus, (30) through (35) apply, $\Psi_o$ is bireciprocal, i.e. is such that equation (38) is valid, $$\Psi_o(1/\psi_1) = 1/\Psi_o(\psi_1). \quad (38)$$

When $\rho'_o = \rho'_o(\psi_1^2)$ and $S'_o = S'_o(\psi_1)$ are defined by $$\rho'_o(\psi_1^2) = \rho_o(1/\psi_1^2), \quad S'_o(\psi_1) = S_o(1/\psi_1),$$

then equation (38) is equivalent to $\rho'_o = -1/\rho_o$ and, in view of the first equality in equation (33), thus becomes $$S_o S'_o = -\bar{S}_o \bar{S}'_o. \quad (39)$$

In view of equations (5) and (11), note that due to equation (39), $\alpha$ and the corresponding attenuation $\alpha_{11} = -\ln|S_{11}|$ are, in $\psi$, mirror-inverted relative to one another with respect to $\pi/2T_1$ and that $$e^{-2\alpha(\pi/2T_1 - \omega_1)} - E^{2\alpha(\pi/2T_1 + \omega_1)} = 1$$

is valid. Obvious, $S_o$, $S'_o$, $\bar{S}_o$ and $\bar{S}'_o$ are all-pass functions and all have the same degree. Since $\rho_o = \bar{S}_o/S_o$ applies and the scattering Hurwitz polynomials $g_o$ and $\bar{g}_o$ are relatively prime, $S_o$ and $\bar{S}_o$ also have no common all-pass factor (i.e., of the degree $\geq 1$). We thus conclude from equation (39) that $\bar{S}_o = \gamma S'_o$, whereby $\gamma$ is a constant and, thus, $\bar{S}'_o = \gamma S'_o$ is valid. When these expressions are entered in equation (39), then $\gamma^2 = -1$ is obtained, i.e. $\gamma = \pm j$, and, thus $$S_o = \pm j S'_o. \quad (40)$$

When finally, $\gamma_i = \gamma_o$ is selected for $i = 1$ to k, then equations (29) and (37) supply $$S_i(\psi_i) = S_o(\psi_i), \quad i = 1 \text{ to } k,$$

so that equation (40) is equivalent to $$S_i(\psi_i) = \pm j S_i(1/\psi_i), \quad i = 1 \text{ to } k. \quad (41)$$

When $\psi_i$ is replaced with $1/\psi_i$, this being equivalent to replacing $z_i$ with $-z_i$, then it can be seen from equations (2) and (3) that equation (41) is equivalent to the condition (13) in reference [15]. The realization of the all-pass functions $S_i(\psi_i)$ can thus be executed in the same way as described in reference [15].

A corresponding structure is shown in FIG. 2, where the heavy, solid lines means connections having a suitable multiplicity, for instance the multiplicity m. In particular, it should be noted that—when the signal filtering is connected with a halving or doubling of the sampling rate—the arithmetic functions in the shift-free assemblies that are referenced $N_o$ can be executed with the lower of the sampling rates under consideration (as can be seen in FIG. 2 by further shifting of one of the m-fold shifts referenced $T_i$). For explanation of 1', 1'', 2' and 2'', see FIG. 1. When, over and above this, arguments similar to those explained in appendix A of reference [25] are used, it can be shown that the same simplifications are also generally obtained here for the realization of $N_o$ as discussed, for example in references [25] and [26].

A second special instance can be noted. Instead of a realization of the desired symmetry along the major axes as expressed by equation (38), the same can be achieved along the diagonals. When $\Psi$ is considered a function of $(\Psi_1^2, \ldots \Psi_k^2)$, then the desired relationship is $$\Psi(1/\psi_1^2), \ldots, 1/\psi_k^2) = 1/\Psi(\psi_1^2, \ldots, \psi_k^2)$$

for $\psi_1^2 = \psi_2^2 = \ldots = \psi_k^2$.

A number of generalizations of these special cases are possible in instances wherein the $g_i$ are not simply established by equation (29). In many practical instances, none of these solution formulations will lead to a truly usable solution. A generalized method should be used in such instances, for example in that the behavior of the characteristic function is simultaneously considered along the coordinate axes and along the diagonals.

Further examples will not be given.

Let the simplest type of the polynomial $g_o$ be considered first, i.e.

$$g_o(\psi) = \psi + a + jb, \quad a > 0$$

wherein a and b are constants. Over and above this, a unimodular constant $\gamma_a = \gamma' + j\gamma''$ where $\gamma'$ and $\gamma''$ are real. For d' and d" that are defined by equation (25), one finds $$d' = \gamma'\psi_1^2\psi_2^2 + (\gamma'(b^2-a^2) - 2\gamma''ab)(\psi_1^2 + \psi_2^2) + \gamma'(a^4 + b^4 - 6a^2b^2) + 4\gamma''ab(a^2-b^2)$$

$$d'' = \gamma''\psi_1^2\psi_2^2 + (\gamma''(b^2-a^2) + 2\gamma'ab)(\psi_1^2 + \psi_2^2) + \gamma''(a^4 + b^4 - 6a^2b^2) + 4\gamma'ab(b^2-a^2),$$

where $\gamma'^2 + \gamma''^2 = 1$. According to equation (23), $\Psi = d'/d''$ derives.

We now assume that the symmetry expressed by equation (38) is present and use this equation as the starting point. Because of the equations (31), (33) and (34), $\Psi_o$ is bilinear in $\psi_1^2$ and $$\Psi_o = (\psi_1^2 + c)/(c\psi_1^2 + 1) = (\phi_1^2 - c)/c\phi_1^2 - 1)$$

(or the negative of this expression) is then obtained from equation (38), where c is a real constant.

$$\rho_o = j(\psi_1^2 - \epsilon^2)/(\epsilon^2\psi_1^2 - 1)$$

is thus obtained from equation (31b), where $\epsilon^2$ is a unimodular constant that is established by $$\epsilon^2 = (c-j)/(jc-1) \qquad (42)$$

When one proceeds as explained following equation (35), $$d_o = \pm(\psi_1^2 - \epsilon^2)(1+j)/\epsilon\sqrt{2}$$

is found for $d_o$ and one can then select (see equation (34))

$$g_o = \psi_1 + \epsilon, \gamma_o = \pm(1-j)\epsilon/\sqrt{2}$$

and obtains (see equation (32))

$$\gamma_a = \pm(1-j)\epsilon^3/\sqrt{2} = \gamma' + j\gamma''. \qquad (43)$$

With $$\epsilon = a + jb,$$

all parameters are then known, whereby that root from equation (42) for which $a > 0$ is selected.

The simplest case derives for $c = 0$. One then obtains $a = b = 1/\sqrt{2}$, $\gamma' = 0$, $\gamma'' = 1$ and, thus, $$\Psi = (\psi_1^2 + \psi_2^2)/(1 - \psi_1^2\psi_2^2).$$

The resulting $|S_{21}|$, drawn for a rotation of the data by $\pm 45°$ (and thus of the frequency plane as well by $\pm 45°$), is shown in FIG. 3. More precisely expressed, the transformation that was applied to $\omega_1$ and $\omega_2$ is $$\omega'_1 = \omega_1 - \omega_2, \omega'_2 = \omega_1 + \omega_2.$$

With respect to completeness, the described solution is in fact complete, i.e. it covers all characteristic functions that are rational in $\psi_i^2$, $i = 1$ to k. In order to demonstrate this, consider the following theorem whose proof shall be provided below. This theorem is a generalization of related theorems in references [23] and [24].

Theorem 1

Let a real or complex transfer function $H = H(\psi)$ be considered, $$H = f/g \qquad (44)$$

where $f = f(\psi)$ and $g = g(\psi)$ are relatively prime polynomials and g is a scattering Hurwitz polynomial of the kind known from references [21], [22] and [27]. When H is free of all-pass functions and the value of $|H(j\phi)|$ does not change when any of the $\phi_i$, $i\epsilon\{1, \ldots, k\}$ is replaced by the corresponding $-\phi_i$, g can be brought into the form $$g = \gamma g_1 g_2 \cdots g_k \qquad (45)$$

whereby $g_i = g_i(\psi_i)$ is a real polynomial for every $i\epsilon\{1, \ldots, k\}$ that is dependent only on $\psi_i$, and $\gamma$ is a unimodular constant.

When this theorem (for the case of a real transfer function) is used, then the completeness of the described solution can be easily demonstrated. To that end, let any loss-free two-port be considered whose characteristic function has the desired symmetry and that is therefore antimetrical. According to equations (8) and (22b), we have $$S_{21} = f/g = (S_a - S_a)/2j,$$

whereby $S_a$ is defined by equation (16) and can thus be written in the form of equation (18a), namely taking the details recited there into consideration. As was seen in the paragraph following equation (17), $g_a$ is a divisor of g and, thus, $g_a$ can be written in the form $$g_a = g_{a1}g_{a2} \cdots g_{ak}$$

according to equation (44), where $g_{ai} = g_{ai}(\psi_i)$ is a polynomial for every $i\epsilon\{1, \ldots, k\}$ that is dependent only on $\psi_i$. Let it be noted that a unimodular constant like $\gamma$ in equation (45) can, for example, be incorporated in $\gamma_a$ (see equation (18a)). The proof proceeds accordingly if the function $S_{11}$ had been considered instead of $S_{21}$.

PROOF OF THEOREM 1

The proof of theorem 1 follows immediately from lemmae 1 and 4 that are recited below.

Lemma 1. Let us consider a real or complex transfer function $H = f/g$, where f and g are relatively prime polynomials in $\psi$, g is a (real or complex) scattering Hurwitz polynomial and, further, H is assumed to be free of all-pass factors. When it is also assumed that the value of $|H(j\phi)|$ does not change when any of the $\phi_i$, $i\epsilon\{1, \ldots, k\}$ are replaced by the corresponding $-\phi_i$, then $|f(j\phi)|$ and $|g(j\phi)|$ also remain individually unchanged when any one of the substitutions just mentioned is undertaken.

Proof. First note that the main assumption of the lemma amounts to stating that the value of $$H(j\epsilon_1\phi_1, \ldots, j\epsilon_k\phi_k) \cdot H^*(j\epsilon_1\phi_1, \ldots, j\epsilon_k\phi_k) \qquad (46)$$

would remain unchanged when any combination of values ±1 is selected for the $\epsilon_i$, i=1 to k. Correspondingly, the statement of the lemma amounts to starting that the value of $$g(j\epsilon_1\phi_1, \ldots, j\epsilon_k\phi_k)g^*(j\epsilon_1\phi_1, \ldots, j\epsilon_k\phi_k) \qquad (47)$$

would remain unchanged when the $\epsilon_i$ are selected as was just determined. By analytical continuation, it follows from the main assumption that $$\frac{f(\epsilon_1\psi_1, \ldots, \epsilon_k\psi_k)f_*(\epsilon_1\psi_1, \ldots, \epsilon_k\psi_k)}{g(\epsilon_1\psi_1, \ldots, \epsilon_k\psi_k)g_*(\epsilon_1\psi_1, \ldots, \epsilon_k\psi_k)} = \frac{f(\psi)f_*(\psi)}{g(\psi)g_*(\psi)} \qquad (48)$$

must be valid, namely for all allowable selection possibilities of the $\epsilon_i$.

No reducing can be undertaken at the right-hand side of the equation (48). Since namely, f and g are relatively prime, at most f and g* could contain a common factor, for instance d*. In this case, d would be a factor of g and would thus be a scattering Hurwitz polynomial (see corollary 3.1 in reference [22]), i.e. H would contain the all-pass factor d*/d which, however, has been excluded. It thus follows from equation (48) that the relationships $$f(\epsilon_1\psi_1, \ldots, \epsilon_k\psi_k)f_*(\epsilon_1\psi_1, \ldots, \epsilon_k\psi_k) = Kf(\psi)f_*(\psi), \qquad (49)$$

$$g(\epsilon_1\psi_1, \ldots, \epsilon_k\psi_k)g_*(\epsilon_1\psi_1, \ldots, \epsilon_k\psi_k) = kg(\psi)g_*(\psi), \qquad (50)$$

are valid for all allowed $\epsilon_1$, whereby K is a polynomial in principle. When the equations (49) or (50) are applied for $\epsilon_1 = \ldots \epsilon_k = 1$, then one finds K=1, i.e.

$$g(\epsilon_1\psi_1, \ldots, \epsilon_k\psi_k)g_*(\epsilon_1\psi_1, \ldots, \epsilon_k\psi_k) = g(\psi)g_*(\psi). \qquad (51)$$

must be valid for every allowable selection of the i, i=1 to k. Note that the statement of the lemma can be somewhat more generally worded in that one states that the assumption undertaken imply that the equations (49) and (50) are also valid for K=1 when the $\epsilon_i$, for i=1 to k, assume any of the values allowed above.

Lemma 2. Let g be a scattering Hurwitz polynomial in $\psi$ (see equation (40)). We divide the variables $\psi_i$, i=1 to k, in an arbitrary way, in a k'-tuplet $\psi'$ and a k''-tuplet $\psi''$, with $1 \leq k'' \leq k$, k'+k''=k, and we correspondingly express g in the form g ($\psi'$, 104''). Then, g ($\psi'$, $-\psi''$) is a scattering Hurwitz polynomial if and only if g is independent of $\psi''$.

Proof. The condition is obviously sufficient. In order to show that it is also necessary, we assume that the polynomial h that is defined by h($\psi'$, $\psi''$)=g($\psi'$, $-\psi''$) is a scattering Hurwitz polynomial. We consider a fixed value of $\psi'$, for example $\psi'_o$, with Re $\psi'_o > 0$, and define a polynomial $g_1$ in $\psi''$ by $g_1(\psi'') = g(\psi'_o, \psi'')$. As known from reference [27], $g_1$ is a scattering Hurwitz polynomial that has the same degrees (i.e. sub-degrees) in the $\psi_i$ belonging to $\psi''$ as does g($\psi'$, $\psi''$). When g is thus in fact dependent on at least one of the $\psi_i$ that belong to $\psi''$, then (see Theorem 3 of reference [22]) there is a $\psi''_o$ with Re $\psi''_o > 0$, so that $g_1(-\psi''_o) = 0$ is valid, i.e. that h($\psi'_o, \psi''_o$)=0 applies. This is impossible since a scattering Hurwitz polynomial in $\psi$ has no zero places for Re$\psi \geq 0$.

Lemma 3. Let g=g($\psi$) be a real or complex scattering Hurwitz polynomial in $\psi$. g($-\psi$) is then relatively prime with g($\psi$).

Proof. The result is trivial when g is real (since $g_*(\psi) = g(-\psi)$ then applies), but it needs a proof when g is complex. Let us then assume that g($\psi$) and g($-\psi$) have an actual common factor d=d($\psi$) (i.e. a common factor of the degree $\geq 1$). Then d is likewise a scattering Hurwitz polynomial (see corollary 3.1 of reference [22]). A $\psi_o$ with Re $\psi_o > 0$ thus exists such that d($-\psi_o$)=0 applies (cf. Theorem 3 of reference [22]), i.e. that g($\psi_o$)=0 applies.

Lemma 4. Let g be a real or complex scattering Hurwitz polynomial in $\psi$ of the degree $\geq 1$. Then the necessary and sufficient conditions that the value of $|g(j\phi)|$ does not change when any of the $\phi_i$ is replaced by the corresponding $-\phi_i$, are that g can be written in the form of equation (45), where $g_i$ for all i$\in\{1, \ldots, k\}$ is a real polynomial in $\psi_i$ alone and $\gamma$ is a constant that can be real or complex.

Proof. The conditions are obviously sufficient. In order to show that they are also necessary, let one first note that, according to equation (51), one particularly has $$g(\psi)g_*(\psi) = g(-\psi)g_*(-\psi),$$

which is equivalent to $$g(\psi)g^*(-\psi^*) = g(-\psi)g^*(\psi^*).$$

Since, due to g($-\psi$) according to lemma 3 being relatively prime with g($\psi$), we must have $$g(-\psi) = Kg^*(-\psi^*), g(\psi) = Kg^*(\psi^*). \qquad (52)$$

These two expressions are equivalent and one finds that $|K|=1$ applies, i.e. K is not only a polynomial but a unimodular constant. We can therefore select another unimodular constant $\gamma$ such that $K = \gamma^2$ applies. When g' is defined by $\gamma^*g$, then one concludes from equation (52) that $g'(\psi) = g'^*(\psi^*)$ applies, i.e. that g' is a real polynomial.

Let d then be an actual, real, irreducible factor of g (i.e. a real factor of the degree $\geq 1$ that is irreducible over the field of real numbers). This is a scattering Hurwitz polynomial that contains at least one of $\psi_i$, for instance $\psi_k$. On the other hand, equation (51) must again apply in the specified way, i.e., when $\epsilon_1 = \ldots \epsilon_{k-1} = 1$, $\epsilon_k = -1$ is selected and g($\psi'$, $\psi_k$) is substituted for g($\psi$), etc., with $\psi' = (\psi_1, \ldots, \psi_{k-1})$, then one obtains $$g(\psi', \psi_k)g_*(\psi', \psi_k) = g(\psi', -\psi_k)g_*(\psi', -\psi_k).$$

Therewith, d=d($\psi'\psi_k$) must divide either g($\psi'$, $-\psi_k$) or g*($\psi'$, $-\psi_k$). If the first of these alternatives applies, one could conclude—when $\psi_k$ is replaced by $-\psi_k$—that d($\psi'$, $-\psi_k$) is a divisor of g($\psi'$, $\psi_k$) and would thus be a scattering Hurwitz polynomial itself, in which case d would in fact be independent of $\psi_k$ because of lemma 2, contrary to our assumption. If, however, the second of our two said alternatives applies, one could similarly conclude that d*($\psi'$, $-\psi_k$) is a divisor of g($\psi'$, $\psi_k$) and would thus also be a scattering Hurwitz polynomial, i.e., since d is a real polynomial and, thus, d*($\psi' - \psi_k$) = d($-\psi'$, $\psi_k$) applies, that d($-\psi'$, $\psi_k$) would be a scattering Hurwitz polynomial. When, thus, lemma 2 is again applied, one finds that d is independent of $\psi'$.

It will be apparent that various modifications and/or additions may be made in the apparatus of the invention without departing from the essential feature of novelty involved, which are intended to be defined and secured by the appended claims.

APPENDIX

1. T. S. Huang (editor), "Picture Processing and Digital Filtering", Springer-Verlag, Berlin, Germany, 1975.
2. T. S. Huang (editor), "Two Dimensional Digital Signal Processing I", Springer-Verlag, Berlin, Germany, 1981.
3. D. E. Dudgeon and R. M. Mersereau, "Multidimensional Digital Signal Processing", Prentice-Hall, Englewood Cliffs, N.J., 1984.
4. A. Fettweis, "Multidimensional Circuits and Systems Theory", Tutorial Lecture, Proc. IEEE Int. Symp. Circuits Syst., Vol. 3, pp. 951–957, Montreal, Canada, May 1984.
5. A. Fettweis, "Wave Digital Filters: Theory and Practice", Proc. IEEE, Vol. 74, pp. 270–327, February 1986.
6. A. Fettweis, "Principles of Multidimensional Wave Digital Filtering", published in: J. K. Agarwal (editor), "Digital Signal Processing", North Hollywood, CA: Western Periodicals, 1979.
7. A. Fettweis, "Multidimensional Wave Digital Filters—Problems and Progress", Proc. IEEE Int. Symp. on Circuits and Systems, San Jose, CA, May 1986.
8. A. Fettweis, "Design of Recursive Quadrant Fan Filters", Arch. Elektr. Uebertr., Vol. 34, pp. 97–103, March 1980.
9. G. Linnenberg, "Wave Digital Fan Filters: Numerical and Experimental Results", Proc. Eur. Signal Processing Conf., pp. 15–19, Lausanne, Switzerland, September 1980 (published by North Holland, Amsterdam).
10. G. Linnenberg, "Ueber die diskrete Verarbeitung mehrdimensionaler Signale unter Verwendung von Wellendigitalfiltern", Doctoral Dissertation, Ruhr-Universitat Bochum, Bochum, W. Germany, January 1984.
11. A. Fettweis, "Suppression of Parasitic Oscillations in Multidimensional Wave Digital Filters", IEEE Trans. Circuits Syst., Vol. CAS-25, No. 12, pp. 1060–1066, December 1978.
12. V. Belevitch, "Classical Network Theory", Holden-Day, San Francisco, 1968.
13. K. Meerkotter, "Complex Passive Networks and Wave Digital Filters", Proc. Eur. Conf. Circuit Theory and Design, Vol. 2, pp. 24–35, Warsaw, Poland, September 1980.
14. A. Fettweis, "Principles of Complex Wave Digital Filters", Int. J. Circuit Theory Appl., Vol. 9, pp 119–134, April 1981.
15. K. Meerkotter, "Antimetric Wave Digital Filters Derived From Complex Reference Circuits", Proc. Eur. Conf. Circuit Theory and Design, Stuttgart, W. Germany, September 1983.
16. H.-P. Okolowitz, "Zur Synthese verlustfreier Zweitore durch Faktorzerlegung der Betriebskettenmatrizen" Doctoral Dissertation, Ruhr-Universitat Bochum, West German, February 1971.
17. P. Lennarz and L. Hoffmann, "Computer Realization of Two-Dimensional Wave Digital Filters", Proc. 1978 Eur. Conf. Circuit Theory and Design, pp. 360–364, Lausanne, Switzerland, September 1978.
18. P. A. Lennarz and W. Drews, "Design of Circularly Symmetric 2-D Wave Digital Filters", Proc. Second Eur. Signal Processing Conf., pp. 199–202, Erlangen, W. Germany, September 1983.
19. J. L. Shanks and S. Treitel, "Stability and Synthesis of Two-Dimensional Recursive Filters", IEEE Trans. Audio and Electro-Acoustics, Vol. AU-20, pp. 115–128, June 1972.
20. J. M. Costa and A. N. Venetsanopoulos, "Design of Circularly Symmetric Two-Dimensional Recursive Filters", IEEE Trans. Acoust., Speech, and Signal Processing, Vol. ASSP-22, pp. 432–443, December 1974.
21. A. Fettweis, "On the Scattering Matrix and the Scattering Transfer Matrix of Multidimensional Lossless Two-Ports", Arch. Elektr. Uebertr., Vol. 36, pp. 374–381, September 1982.
22. A. Fettweis, "Some Properties of Scattering Hurwitz Polynomials", Arch. Elektr. Uebertr., Vol. 30, pp. 171–176, May–June 1984.
23. P. Karivaratherajan and M. N. S. Swamy, "Some Results on the Nature of a 2-Dimensional Filter Function Possessing Certain Symmetry in its Magnitude Response", Electronic Circuits and Systems, Vol. 2, pp. 147–153, September 1978.
24. P. Kariavatha Rajan, Harnatha C. Reddy, and M. N. S. Swamy, "Fourfold National Symmetry in Two-Dimensional Functions", IEEE Trans. Acoustics, Speech, Signal Processing, Vol. ASSP-30, pp. 488–499, June 1982.
25. A. Fettweis, J. A. Nossek, and K. Meerkotter, "Reconstruction of Signals After Filtering and Sampling Rate Reduction", IEEE Trans. Acoustics, Speech, Signal Processing, Vol. ASSP-33, pp. 893–902, August 1985.
26. L. Gazsi, "Explicit Formulae for Lattice Wave Digital Filters", IEEE Trans. Circuits, Syst., Vol. CAS-32, pp. 68–88, January 1985.
27. A. Fettweis and S. Basu, "New Results on Multidimensional Hurwitz Polynomials", Proc. 1985 Int. Symposium on Circuits and Systems, Vol. 3, pp. 1359–1362, Kyoto, Japan, June 1985.

I claim:

1. In a multi-dimensional digital wave filter having k dimensions, said filter being formed of circuit means composed of logic elements such as adders, multipliers, and shift elements, the combination comprising;

circuit means having a transfer function corresponding to that of an antimetrical filter and having a characteristic function that is a rational function of the squares of the equivalent complex frequencies $\Psi_I$, where i equals 1 ... k, said circuit means having the real transfer functions of a multi-dimensional, complex all-pass filter, said circuit means including means for forming the complex all-pass transfer function as a product of complex individual-pass functions in only one frequency variable ($\Psi_I$), and input and output terminals connected to said circuit means.

2. Digital filter according to claim 1, including means for ensuring that the relationship $$S^*_i(\psi^*_i) = jS_i(1/\psi_i), i=1\ldots k$$

holds for at least one of the individual all-pass functions $S_i(\psi_i)$; the asterisk (*) denoting the transition to the complex conjugate value and j denoting the imaginary unit.

* * * * *